(12) United States Patent
Van Duren et al.

(10) Patent No.: US 8,048,477 B2
(45) Date of Patent: Nov. 1, 2011

(54) CHALCOGENIDE SOLAR CELLS

(75) Inventors: Jeroen K. J. Van Duren, Menlo Park, CA (US); Brent J. Bollman, Belmont, CA (US); Martin Roscheisen, San Francisco, CA (US); Brian Sager, Menlo Park, CA (US)

(73) Assignee: Nanosolar, Inc., San Jose, CA (US)

( * ) Notice: Subject to any disclaimer, the term of this patent is extended or adjusted under 35 U.S.C. 154(b) by 1187 days.

(21) Appl. No.: 11/290,633

(22) Filed: Nov. 29, 2005

(65) Prior Publication Data

US 2007/0092648 A1   Apr. 26, 2007

Related U.S. Application Data

(63) Continuation-in-part of application No. 10/782,017, filed on Feb. 19, 2004, now Pat. No. 7,663,057, and a continuation-in-part of application No. 10/943,657, filed on Sep. 18, 2004, now Pat. No. 7,306,823, and a continuation-in-part of application No. 11/081,163, filed on Mar. 16, 2005, now abandoned.

(51) Int. Cl.
*B05D 5/06* (2006.01)
(52) U.S. Cl. .......................................................... 427/74
(58) Field of Classification Search ............... 427/64–68, 427/376.1
See application file for complete search history.

(56) References Cited

U.S. PATENT DOCUMENTS

| | | | |
|---|---|---|---|
| 5,445,847 A | 8/1995 | Wada et al. | 427/74 |
| 5,538,903 A | 7/1996 | Aramoto et al. | 438/94 |
| 5,567,469 A | 10/1996 | Wada et al. | 427/74 |
| 5,728,231 A | 3/1998 | Negami et al. | 148/33 |
| 5,817,410 A * | 10/1998 | Tsujimura et al. | 428/328 |
| 5,985,691 A | 11/1999 | Basol et al. | 438/95 |
| 6,124,041 A | 9/2000 | Aoude et al. | 428/472 |
| 6,126,740 A | 10/2000 | Schulz et al. | 117/4 |
| 6,127,202 A * | 10/2000 | Kapur et al. | 438/47 |
| 6,228,904 B1 | 5/2001 | Yadav et al. | 523/210 |
| 6,268,014 B1 | 7/2001 | Eberspacher et al. | 427/74 |
| 6,323,417 B1 | 11/2001 | Gillespie et al. | 136/262 |
| 6,454,886 B1 | 9/2002 | Martin et al. | 149/2 |
| 6,472,459 B2 | 10/2002 | Morales et al. | 524/439 |

(Continued)

OTHER PUBLICATIONS

Dabbousi et al., "(CdSe)ZnS Core-Shell Quantom Dots: Synthesis and Characterization of a Size Series of Highly Luminscent Nanocrystallites," J. Phys. Chem. B, 101, 9463-9475 (1997).*

(Continued)

*Primary Examiner* — Michael Cleveland
*Assistant Examiner* — Robert Vetere
(74) *Attorney, Agent, or Firm* — Joshua D. Isenberg; JDI Patent

(57) ABSTRACT

A precursor material for forming a film of a group IB-IIIA-chalcogenide compound and a method of making this film are disclosed. The film contains group IB-chalcogenide nanoparticles and/or group IIIA-chalcogenide nanoparticles and/or nanoglobules and/or nanodroplets and a source of extra chalcogen. Alternatively, the film may contain core-shell nanoparticles having core nanoparticles include group IB and/or IIIA elements, which are coated with a shell of elemental chalcogen material. The method of making a film of group IB-IIIA-chalcogenide compound includes mixing the nanoparticles and/or nanoglobules and/or nanodroplets to form an ink, depositing the ink on a substrate, heating to melt the extra chalcogen and to react the chalcogen with the group IB and group IIIA elements and/or chalcogenides to form a dense film.

70 Claims, 4 Drawing Sheets

U.S. PATENT DOCUMENTS

| | | | |
|---|---|---|---|
| 6,518,086 B2 * | 2/2003 | Beck et al. | 438/95 |
| 6,821,559 B2 | 11/2004 | Eberspacher et al. | 427/226 |
| 2002/0006470 A1 | 2/2002 | Eberspacher et al. | 427/216 |
| 2004/0219730 A1 | 11/2004 | Basol | 438/200 |
| 2005/0183767 A1 | 8/2005 | Yu et al. | 136/263 |

OTHER PUBLICATIONS

S. L. Castro et. al. "Nanocrystalline Chalcopyrite Materials ($CuInS_2$ and $CuInSe_2$) via Low-Temperature Pyrolysis of Molecular Single-Source Precursors" *Chem. Mater*, vol. 15, pp. 3142-3147, 2003.

B. A. Ridley et al, "All-Inorganic Field Effect Transistors Fabricated by Printing" in *Science*, vol. 286, pp. 746-749, Oct. 22, 1999.

J. Zhu, et al, "General Sonochemical Method for the Preparation of Nanophasic Selenides: Synthesis of ZnSe Nanoparticles" in *Chem. Mater*. 2000, vol. 12, pp. 73-78.

B. Li, et al. "Synthesis by a Solvothermal Route and Characterization of CuInSe2 Nanowhiskers and Nanoparticles" in *Advanced Materials*, vol. 11, No. 17, pp. 1456-1459, 1999, Wiley-VCH Verlag GmbH.

P. Sen, et al. "Preparation of Cu, Ag, Fe and Al nanoparticles by the exploding wire technique" in *Proc. Indian Acad. Sci. (Chem. Sci.)*, vol. 115, Nos. 5 & 6, pp. 499-508, Oct.-Dec. 2003, Indian Academy of Sciences.

M. A. Malik et al. "A Novel Route for the Preparation of CuSe and CuInSe2 Nanoparticles" in *Advanced Materials*, vol. 11, No. 17, pp. 1441-1444, Wiley-VCH Verlag GmbH, Weinheim, 1999.

K. K. Banger et al. "Synthesis and Characterization of the First Liquid Single-Source Precursors for the Deposition of Ternary Chalcopyrite (CuInS2) Thin Film Materials" in *Chem. Mater.*, vol. 13, 3827-3829, 2001, American Chemical Society.

U.S. Appl. No. 11/081,163, entitled "Metallic Dispersion", filed Mar. 16, 2005.

U.S. Appl. No. 10/943,658, titled "Formation of CIGS Absorber Layer Materials Using Atomic Layer Deposition and High Throughput Surface Treatment", filed Sep. 18, 2004.

Granqvist, C.G. and R.A. Buhrman. "Ultrafine metal particles". J. Applied Physics 47 (5): 220-2219 (1976).

F. Tepper et al, "Nanosized Alumina Fibers", *Advanced Materials*, American Ceramic Society Bulletin, vol. 80, No. 6, Jun. 2001.

Subramanian, P.R. and Laughlin, D.E., in *Binary Alloy Phase Diagrams, 2nd Edition*, edited by Massalski, T.B. 1990. ASM international, Materials Park, OH, pp. 1410-1412.

Ag-Ga and Cu-Ga Phase Diagrams. Nov. 1999.

U. Jeong et al. "Synthesis of Monodisperse Spherical Colloids of Amorphous Selenium", *Advanced Materials*, vol. 17, No. 1, Jan. 6, 2005, pp. 102-106.

J. Park et al. "Synthesis of "Solid Solution" and "Core-Shell" Type Cobald-Platinum Magnetic Nanoparticles via Transmetalation Reactions", *Journal of the American Chemical Society*, 123, May 25, 2001, pp. 5743-5746.

Yuliang Wang and Younan Xia , "Bottom-Up and Top-Down Approaches to the Synthesis of Monodispersed Spherical Colloids of Low Melting-Point Metals", *Nano Letters*, vol. 4, No. 10, Sep. 2, 2004, pp. 2047-2050.

* cited by examiner

_US 8,048,477 B2_

CHALCOGENIDE SOLAR CELLS

CROSS-REFERENCE TO RELATED APPLICATION

This application is a continuation-in-part of commonly-assigned, application Ser. No. 10/782,017, now U.S. Pat. No. 7,663,057, entitled "SOLUTION-BASED FABRICATION OF PHOTOVOLTAIC CELL" filed Feb. 19, 2004 and published as U.S. patent application publication 20050183767, the entire disclosures of which are incorporated herein by reference. This application is also a continuation-in-part of commonly-assigned, U.S. patent application Ser. No. 10/943,657, now U.S. Pat. No. 7,306,823, entitled "COATED NANOPARTICLES AND QUANTUM DOTS FOR SOLUTION-BASED FABRICATION OF PHOTOVOLTAIC CELLS" filed Sep. 18, 2004, the entire disclosures of which are incorporated herein by reference. This application is a also continuation-in-part of commonly-assigned, U.S. patent application Ser. No. 11/081,163, now abandoned, entitled "Metallic Dispersion", filed Mar. 16, 2005, the entire disclosures of which are incorporated herein by reference.

FIELD OF THE INVENTION

This invention relates to solar cells and more specifically to fabrication of solar cells that use active layers based on IB-IIIA-VIA compounds.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide ($ZnO_x$) is formed on the junction partner layer and is typically used as a transparent electrode. CIS-based solar cells have been demonstrated to have power conversion efficiencies exceeding 19%.

A central challenge in cost-effectively constructing a large-area CIGS-based solar cell or module is that the elements of the CIGS layer must be within a narrow stoichiometric ratio on nano-, meso-, and macroscopic length scale in all three dimensions in order for the resulting cell or module to be highly efficient. Achieving precise stoichiometric composition over relatively large substrate areas is however difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result in non-uniform three-dimensional distribution of the elements in all three dimensions and/or poor film-thickness uniformity over large areas. These non-uniformities can occur over the nano-, meso-, and/or macroscopic scales. Such non-uniformity also alters the local stoichiometric ratios of the absorber layer, decreasing the potential power conversion efficiency of the complete cell or module.

Alternative approaches to vacuum-based deposition techniques such as sputtering and evaporation have been developed. In particular, production of solar cells on flexible substrates using semiconductor printing technologies provides a highly cost-efficient alternative to conventional vacuum-deposited solar cells. For example, T. Arita and coworkers [20th IEEE PV Specialists Conference, 1988, page 1650] described a screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the $CuInSe_2$ phase. However, solar cells fabricated from the sintered layers had very low efficiencies because the structural and electronic quality of these absorbers was poor.

Screen-printed $CuInSe_2$ deposited in a thin-film was also reported by A. Vervaet et al. [9th European Communities PV Solar Energy Conference, 1989, page 480], where a micron-sized $CuInSe_2$ powder was used along with micron-sized Se powder to prepare a screen printable paste. Layers formed by screen printing were sintered at high temperature. A difficulty in this approach was finding an appropriate fluxing agent for dense $CuInSe_2$ film formation. Solar cells made in this manner also had poor conversion efficiencies.

U.S. Pat. No. 5,985,691 issued to B. M. Basol et al describes another particle-based method to form a Group IB-IIIA-VIA compound film. The described method includes the steps of preparing a source material, depositing the source material on a base to form a precursor, and heating the precursor to form a film. In that method the source material includes Group IB-IIIA containing particles having at least one Group IB-IIIA phase, with Group IB-IIIA constituents present at greater than about 50 molar percent of the Group IB elements and greater than about 50 molar percent of the Group IIIA elements in the source material. The powder is milled to reduce its particle size and then used in the preparation of an ink which is deposited on the substrate in the form of a precursor layer. The precursor layer is then exposed to an atmosphere containing Group VIA vapors at elevated temperatures to convert the film into the compound. The precursor films deposited using this technique were porous and they yielded porous $CuInSe_2$ layers with small-grain regions as reported by G. Norsworthy et al. [Solar Energy Materials and Solar Cells, 2000, vol. 60, page 127]. Porous solar cell absorbers yield unstable devices because of the large internal surface area within the device, and small grains limit the conversion efficiency of solar cells. Another key limitation of this method was the inability to effectively incorporate gallium into the material. The properly-distributed presence of gallium in a CIS film serves to potentially broaden the bandgap of the semiconductor material, thereby increasing the open circuit voltage of the solar cell, and to promote the adhesion of the CIGS layer to a (Mo) electrode, providing a back surface electric field which can improve the collection of carriers. The absence of gallium decreases the potential power conversion efficiency of the solar cell. In practice, while gallium oxide particles can easily be produced, it is very difficult to reduce gallium oxide, even at relatively high temperatures, and in the absence of reduction, gallium oxide cannot be effectively used as a precursor material for gallium in the final film. Accordingly, in addition to poor stability, solar cells made using the approach of Basol et al. had suboptimal power conversion efficiency.

Eberspacher and Pauls in U.S. Pat. No. 6,821,559 describe a process for making phase-stabilized precursors in the form of fine particles, such as sub-micron multinary metal particles, and multi-phase mixed-metal particles comprising at least one metal oxide. The preparation of particulate materials was described using a range of methods including laser pyrolysis, atmospheric arc evaporation, solution precipitation, chemical vapor reactions, aerosol pyrolysis, vapor condensation, and laser ablation. In particular, aerosol pyrolysis was used to synthesize mixed-metal particulates comprising metal oxides formed as substantially solid and spherical particulates. These particulate precursor materials were then deposited onto large-area substrates in thin layers using any of a variety of techniques including slurry spraying methods such as pneumatic spraying with a pressurized gas nozzle, hydraulic spraying with a pressurized slurry expelled through an orifice, and ultrasonic spraying with a rapidly vibrating atomization surface. A disadvantage of solar cell devices comprised of thin-film absorber layers formed in this manner was the poor reproducibility of the resulting device performance, and the porous form of the absorber layer, which tends to result in poor device stability.

Bulent Basol in U.S. Published Patent application number 20040219730 describes a process of forming a compound film including formulating a nano-powder material with a controlled overall composition and having particles of one solid solution. The nano-powder material is deposited on a substrate to form a layer on the substrate, and this layer is reacted in at least one suitable atmosphere to form the compound. Due to the improved process window made available by the phase space of a solid solution, the use of nanoparticles comprised of a solid solution may improve the repeatability and the overall yield of the thin-film deposition and solar cell production process. However, a means to incorporate additional Ga beyond that possible through a solid-solution (containing either Cu+Ga or In+Ga) restricts the potential performance of a device constructed by this method. In particular, since the presence of additional gallium in the light absorbing film serves both to broaden the bandgap of the semiconductor material and to increase the open circuit voltage of the solar cell, a lack of additional gallium in the light-absorbing thin film tends to decrease the potential power conversion efficiency of solar cells created in this manner. Using the solid-solution approach, Gallium can be incorporated into the metallic dispersion in non-oxide form—but only with up to approximately 18 relative atomic percent (Subramanian, P. R. and Laughlin, D. E., in *Binary Alloy Phase Diagrams*, $2^{nd}$ *Edition*, edited by Massalski, T. B. 1990. ASM international, Materials Park, Ohio, pp 1410-1412; Hansen, M., *Constitution of Binary Alloys*. 1958. $2^{nd}$ Edition, McGraw Hill, pp. 582-584.). However, efficient CIGS solar cells benefit from achieving a gallium ratio of up to 25 relative atomic percent. Furthermore, it would be simpler to directly work with elemental metallic nanoparticles, nanoglobules, or nanodroplets rather than solid-solution metallic nanoparticles in that the elements can be optimized individually and they are more readily available in elemental form. However, no technique was known in the prior art to create gallium nanoparticle powders sufficient and adequate for semiconductor applications, in part because gallium is molten at room temperature and therefore does not lend itself to common techniques for creating nanoparticles in the form of powders that are then dispersed in solution (as commonly done with the other elements). As a result, it was not possible in the prior art to directly incorporate gallium (or incorporate gallium in a high percentage) into the metallic dispersion used to print the CIG precursor of a CIGS solar cell.

U.S. patent application Ser. No. 11/081,163, now abandoned describes a process of forming a compound film by formulating a mixture of elemental nanoparticles composed of the IB, the IIIA, and, optionally, the VIA group of elements having a controlled overall composition. The nanoparticle mixture is combined with a suspension of nanoglobules of gallium to form a dispersion. The dispersion may be deposited onto a substrate to form a layer on the substrate. The layer may then be reacted in a suitable atmosphere to form the compound film. The compound film may be used as a light-absorbing layer in a photovoltaic device. This process provides a method of forming a material comprised of gallium-containing CIGS precursor materials, where the precursor materials can be reproducibly, uniformly, and densely applied over large substrate areas to form a thin-film CIGS solar cell, and where the gallium is directly included in an elemental form.

Even with direct incorporation of gallium into the CIG precursor film, compositional non-uniformity can still be present on one or more length scales and on either one, two, or three directions both for CIG precursor layers and for the CIGS compound film. In particular, non-uniformities can arise from the formation of more than one single phase when preparing the CIG precursor layer with the composition required for a high-efficiency thin-film CIGS solar cell or module. Rapid thermal processing such a non-uniform CIG precursor layer in the presence of VIA sources can result in both lateral non-uniformity of the final CIGS, and (large) CIS crystals at the front whereas the back mainly contains (small) Ga-rich CIGS crystals. One way to overcome both the non-uniformity in composition for CIGS as formed via rapid thermal processing of CIG precursor layers in the presence of VIA sources and at the same time be able to form CIGS faster than made via the conventional evaporation and sputtering methods is to choose a different yet fast route for the formation to CIGS. A preferred method would be to form precursor materials where most of the IB and IIIA elements are already incorporated in a binary, ternary, or multinary chalcogenide nanopowder, deposit these nanopowders via fast solution-based deposition techniques, and subsequently rapidly thermal process these solution-deposited nanopowders into a dense CIGS film.

Others have tried using chalcogenide powders as precursor material, e.g. micron-sized CIS powders deposited via screen-printing, amorphous quarternary selenide nanopowder or a mixture of amorphous binary selenide nanopowders deposited via spraying on a hot substrate, and other examples [(1) Vervaet, A. et al., E. C. Photovoltaic Sol. Energy Conf., Proc. Int. Conf., 10th (1991), 900-3; (2) Journal of Electronic Materials, Vol. 27, No. 5, 1998, p. 433; Ginley et al.; (3) WO 99,378,32; Ginley et al.; (4) U.S. Pat. No. 6,126,740]. So far, no promising results have been obtained when using chalcogenide powders for fast processing to form CIGS thin-films suitable for solar cells.

Due to high temperatures and/or long processing times required for sintering, formation of a IB-IIIA-chalcogenide compound film suitable for thin-film solar cells is challenging when starting from IB-IIIA-chalcogenide powders where each individual particle contains appreciable amounts of all IB, IIIA, and VIA elements involved, typically close to the stoichiometry of the final IB-IIIA-chalcogenide compound film. In particular, due to the limited contact area between the solid powders in the layer and the high melting points of these ternary and quarternary materials, sintering of such deposited layers of powders either at high temperatures or for extremely long times provides ample energy and time for phase separation, leading to poor compositional uniformity of the CIGS absorber layer at multiple spatial scales. Poor uniformity was evident by a wide range of heterogeneous layer features, including but not limited to porous layer structure, voids, gaps, cracking, and regions of relatively low-density. This non-uniformity is exacerbated by the complicated sequence of phase transformations undergone during the formation of CIGS crystals from precursor materials. In particular, multiple phases forming in discrete areas of the nascent absorber film will also lead to increased non-uniformity and ultimately poor device performance.

The requirement for fast processing then leads to the use of high temperatures, which would damage temperature-sensitive foils used in roll-to-roll processing. Indeed, temperature-sensitive substrates limit the maximum temperature that can be used for processing a precursor layer into CIS or CIGS to a level that is typically well below the melting point of the ternary or quarternary selenide (>900° C.). A fast and high-temperature process, therefore, is less preferred. Both time and temperature restrictions, therefore, have not yet resulted in promising results on suitable substrates using ternary or quaternary selenides as starting materials.

As an alternative, starting materials may be based on a mixture of binary selenides, which at a temperature above 500° C. would result in the formation of a liquid phase that would enlarge the contact area between the initially solid powders and, thereby, accelerate the sintering process as compared to an all-solid process. Unfortunately, below 500° C. no liquid phase is created.

Thus, there is a need in the art, for a rapid yet low-temperature technique for fabricating high-quality and uniform CIGS films for solar modules and suitable precursor materials for fabricating such films.

SUMMARY OF THE INVENTION

The disadvantages associated with the prior art are overcome by embodiments of the present invention directed to the introduction of IB and IIIA elements in the form of chalcogenide nanopowders and combining these chalcogenide nanopowders with an additional source of chalcogen such as selenium or sulfur, tellurium or a mixture of two or more of these, to form a group IB-IIIA-chalcogenide compound. According to one embodiment a compound film may be formed from a mixture of binary selenides, sulfides, or tellurides and selenium, sulfur or tellurium. According to another embodiment, the compound film may be formed using core-shell nanoparticles having core nanoparticles containing group IB and/or group IIIA elements coated with a non-oxygen chalcogen material.

BRIEF DESCRIPTION OF THE DRAWINGS

The teachings of the present invention can be readily understood by considering the following detailed description in conjunction with the accompanying drawings, in which.

GLOSSARY

Figure 1A:
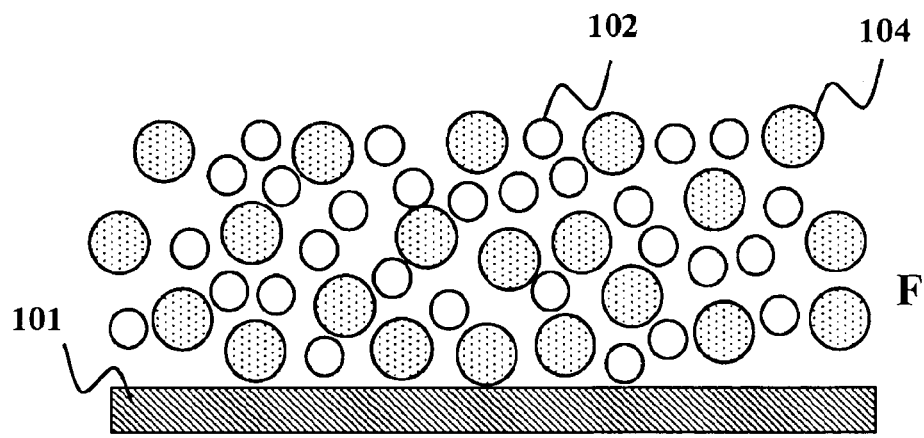
FIGS. 1A-1C are a sequence of schematic diagrams illustrating the formation of chalcogenide film from binary nanoparticles and chalcogen particles according to an embodiment of the present invention.

As used herein, the following terms have the following meanings:

Binary alloy: an alloy with two elements.

Compound: Two or more elements combined with an appreciable amount of order for the spatial distribution of the elements Chalcogen: name for the periodic table group 16 (old-style: group VIA) in the periodic table. Examples of chalcogens include selenium (Se) and sulfur (S) and tellurium (Te).

Chalcogenide: compound of the heavier chalcogens (particularly the sulfides, selenides and tellurides).

Dispersion: mixture of (a) one or more solvents with (b) zero, one or more additives, and with (c) nanostructured material(s) in the form of one or more powders and/or nanopowders and/or particles and/or nanoparticles and/or droplets and/or nanodroplets and/or nanoglobules where these nanostructured material(s) contain one or more elements or compounds other than the material comprising the one or more solvents in the dispersion.

Group IB-chalcogenide—chalcogenide compound formed with one or more elements of group 11 (old-style: IB group), e.g., copper (Cu), silver (Ag), gold (Au) and roentgenium.

Group IIIA-chalcogenide—chalcogenide compound formed with one or more elements of group 13 (old style: IIIA group), e.g., aluminum (Al), indium (In), gallium (Ga), thallium (Ti) and ununtrium.

Group IB-IIIA-chalcogenide compound: compound of one or more group IB elements, one or more group IIIA elements and one or more chalcogens. Examples include $CuInGaSe_2$.

Non-oxide chalcogenide: chalcogenide compound that does not contain oxygen above about 5.0 weight-percentage.

Non-oxygen chalcogen: a chalcogen other than oxygen, e.g., selenium, sulfur or tellurium.

Particle: an aggregation of sufficiently many atoms or molecules that it can be assigned aggregate properties such as volume, mass, density, and temperature.

Particulate: a state of matter in which there is an aggregation of sufficiently many atoms or molecules such that the matter can be assigned aggregate properties such as volume, mass, density, and temperature.

Precursor: material that after one or more processing steps, possibly by combining it with other precursors, results in the targeted compound.

Precursor material: material that after one or more processing steps, possibly by combining it with other precursors, results in the targeted compound.

Nanodroplet: a small particle of liquid, where the particle ranges in size from about 1 nm to about 1000 nm.

Nanoglobule: a small particle of matter, in molten form, where the particle ranges in size from about 1 nm to about 1000 nm.

Nanoparticle: an aggregate of atoms that form, where the aggregate ranges in size from about 1 nm to about 1000 nm.

Nanoparticle precursor: nanoparticulate material that after one or more processing steps, possibly by combining it with other precursors, results in the targeted compound.

Nanopowder: solid particles with an average particle size below or equal to 1 micrometer.
Sub-micron: below 1 micron.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention take advantage of the chemistry and phase behavior of mixtures of group IB, IIIA and chalcogen materials. When forming IB-IIIA-VIA compounds such as CuIn(Se,S) compounds starting from precursors containing a mixture of these elements the mixture goes through a complicated sequence of phases before forming the final compound. It is noted that for several different routes to form these IB-IIIA-VIA compounds just before forming the desired CuIn(Se,S) compound the mixture passes through a phase where the binary alloys copper chalcogenide, indium chalcogenide gallium chalcogenide and the chalcogen are present. In addition, it is noted that a disadvantage of prior techniques is that they either tended to produce a small contact area between the chalcogen (e.g., Se or S) and the other elements or not used a separate source of chalcogen at all.

To overcome these drawbacks a solution is proposed wherein the precursor material contains binary chalcogenide nanopowders, e.g., copper selenide, and/or indium selenide and/or gallium selenide and/or a source of extra chalcogen, e.g., Se or S nanoparticles less than about 200 nanometers in size. If the chalcogen melts at a relatively low temperature (e.g., 220° C. for Se, 120° C. for S) the chalcogen is already in a liquid state and makes good contact with the nanoparticles. If the nanoparticles and chalcogen are then heated sufficiently (e.g., at about 375° C.) the chalcogen reacts with the chalcogenides to form the desired IB-IIIA-chalcogenide material.

It should also be understood that group IB, IIIA, and VIA elements other than Cu, In, Ga, Se, and S may be included in the description of the IB-IIIA-VIA alloys described herein, and that the use of a hyphen ("-" e.g., in Cu—Se or Cu—In—Se) does not indicate a compound, but rather indicates a coexisting mixture of the elements joined by the hyphen. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or indium (In). Group VIA elements of interest include selenium (Se), sulfur (S), and tellurium (Te), and preferably the group VIA element is either Se and/or S.

An alternative way to take advantage of the low melting points of chalcogens such as Se and S is to form core-shell nanoparticles in which the core is an elemental or binary nanoparticle and the shell is a chalcogen coating. The chalcogen melts and quickly reacts with the material of the core nanoparticles.

Formation of Group IB-IIIA-VIA non-oxide nanopowders is described in detail, e.g., in US Patent Application publication 20050183767 entitled "Solution-based fabrication of photovoltaic cell" which has been incorporated herein by reference.

According to an embodiment of the invention, a film of a group IB-IIIA-chalcogenide compound is formed on a substrate 101 from binary alloy chalcogenide nanoparticles 102 and a source of extra chalcogen, e.g., in the form of a powder containing chalcogen particles 104 as shown in FIG. 1A. The binary alloy chalcogenide nanoparticles 102 include group IB-binary chalcogenide nanoparticles (e.g. group IB non-oxide chalcogenides, such as CuSe, CuS or CuTe) and/or group IIIA-chalcogenide nanoparticles (e.g., group IIIA non-oxide chalcogenides, such as Ga(Se, S, Te), In(Se, S, Te) and Al(Se, S, Te). The binary chalcogenide nanoparticles 102 may be less than about 500 nm in size, preferably less than about 200 nm in size. The chalcogen particles may be micron- or submicron-sized non-oxygen chalcogen (e.g., Se, S or Te) particles, e.g., a few hundred nanometers or less to a few microns in size.

Figure 1B:
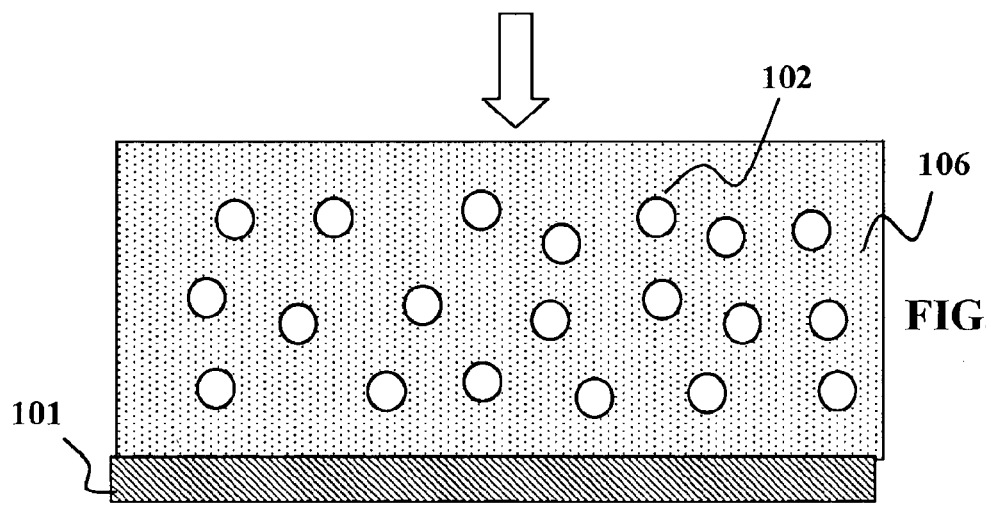
Figure 1C:
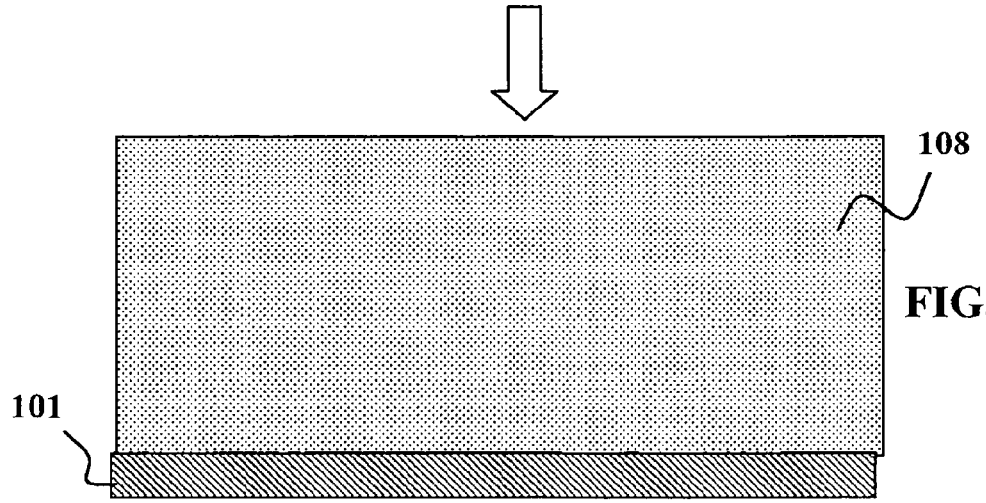

The mixture of binary alloy chalcogenide nanoparticles 102 and chalcogen particles 104 is placed on the substrate 101 and heated to a temperature sufficient to melt the extra chalcogen particles 104 to form a liquid chalcogen 106 as shown in FIG. 1B. The liquid chalcogen 106 and binary nanoparticles 102 are heated to a temperature sufficient to react the liquid chalcogen 106 with the binary chalcogenide nanoparticles 102 to form a dense film of a group IB-IIIA-chalcogenide compound 108 as shown in FIG. 1C. The dense film of group IB-IIIA-chalcogenide compound is then cooled down.

The binary chalcogenide particles 102 may be obtained starting from a binary chalcogenide feedstock material, e.g., micron size particles or larger. Examples of chalcogenide materials available commercially from Cerac, Incorporated of Milwaukee, Wis. are listed in Table I below.

TABLE I

| Item # | Chemical | Formula | Description | Typical % Purity | CAS # |
|---|---|---|---|---|---|
| A-1129 | Aluminum selenide | $Al_2Se_3$ | pieces ≦ 6 mm | 99.5 | 1302-82-5 |
| A-1143 | Aluminum sulfide | $Al_2S_3$ | pieces ≦ 6 mm | 98 | 1302-81-4 |
| A-1133 | Aluminum sulfide | $Al_2S_3$ | −100 mesh | 99.9 | 1302-81-4 |
| A-1135 | Aluminum telluride | $Al_2Te_3$ | pieces ≦ 6 mm | 99.5 | 12043-29-7 |
| C-1148 | Copper selenide | CuSe | pieces ≦ 6 mm | 99.5 | 1317-41-5 |
| C-1149 | Copper selenide | $Cu_2Se$ | pieces ≦ 6 mm | 99.5 | 20405-64-5 |
| G-1034 | Gallium selenide | $Ga_2Se_3$ | pieces ≦ 6 mm | 99.999 | 12024-24-7 |

TABLE I-continued

| Item # | Chemical | Formula | Description | Typical % Purity | CAS # |
|---|---|---|---|---|---|
| C-1152 | Copper sulfide | $Cu_2S$ (may be $Cu_{1.8}$—2S) | −200 mesh | 99.5 | 22205-45-4 |
| C-1153 | Copper sulfide | CuS | −200 mesh | 99.5 | 1317-40-4 |
| C-1251 | Copper sulfide | CuS | −100 mesh | 99.99 | 1317-40-4 |
| C-1155 | Copper telluride | CuTe (generally $Cu_{1.4}Te$) | −60 mesh | 99.5 | 12019-23-7 |
| C-1156 | Copper telluride | $Cu_2Te$ | Pieces ≦ 3 mm | 99.5 | 12019-52-2 |
| G-1035 | Gallium sulfide | $Ga_2S_3$ | −100 mesh | 99.95 | 12024-22-5 |
| G-1067 | Gallium sulfide | GaS | pieces ≦ 6 mm | 99.95 | 12024-10-1 |
| G-1036 | Gallium telluride | GaTe | pieces ≦ 6 mm | 99.999 | 12024-14-5 |
| G-1037 | Gallium telluride | $Ga_2Te_3$ | ≦6 mm pieces | 99.999 | 12024-27-0 |
| I-1013 | Indium selenide | $In_2Se_3$ | pieces ≦ 6 mm (melted) | 99.999 | 12056-07-4 |
| I-1066 | Indium selenide | $In_2Se_3$ | −325 mesh (typ. 10 microns aver. or less) | 99.99% | 12056-07-4 |
| I-2008 | Indium selenide | $In_2Se_3$ | −325 mesh (typ. 10 microns aver. or less) | 99.9 | 12056-07-4 |
| SS-705 | Indium selenide | $In_2Se_3$ | Target | 99.9 | 12056-07-4 |
| I-1017 | Indium sulfide | InS | −100 mesh | 99.999 | 12030-14-7 |
| I-1015 | Indium sulfide | $In_2S_3$ | −200 mesh | 99.99 | 12030-24-9 |
| I-1067 | Indium telluride | $In_2Te_3$ | −325 mesh (typ. 10 microns aver. or less) | 99.999 | 1312-45-4 |
| I-1018 | Indium telluride | $In_2Te_3$ | ≦6 mm pieces | 99.999 | 1312-45-4 |

The binary chalcogenide feedstock may be ball milled to produce particles of the desired size. Binary alloy chalcogenide particles such as GaSe may alternatively be formed by pyrometallurgy. In addition InSe nanoparticles may be formed by melting In and Se together (or InSe feedstock) and spraying the melt to form droplets that solidify into nanoparticles.

The chalcogen particles 104 may be larger than the binary chalcogenide nanoparticles 102 since chalcogen particles 104 melt before the binary nanoparticles 102 and provide good contact with the material of the binary nanoparticles 102. Preferably the chalcogen particles 104 are smaller than the thickness of the IB-IIIA-chalcogenide film 108 that is to be formed.

The chalcogen particles 104 (e.g., Se or S) may be formed in several different ways. For example, Se or S particles may be formed starting with a commercially available fine mesh powder (e.g., 200 mesh/75 micron) and ball milling the powder to a desirable size. Examples of chalcogen powders and other feedstocks commercially available from Cerac, Incorporated of Milwaukee, Wis. are listed in Table II below.

TABLE II

| Item # | Chemical | Formula | Description | Typical % Purity | CAS # |
|---|---|---|---|---|---|
| S-1162 | Selenium metal | Se | 3 mm shot | 99.99 | 7782-49-2 |
| S-1167 | Selenium metal | Se | −325 mesh (avg. ≦ 10 microns | 99.6 | 7782-49-2 |
| S-2000 | Selenium metal | Se | −20 mesh | 99.6 | 7782-49-2 |
| S-2025 | Selenium metal | Se | −200 mesh | 99.999 | 7782-49-2 |
| S-1037 | Selenium metal | Se | 3 mm shot | 99.999 | 7782-49-2 |
| S-1159 | Sulfur | S | Pieces ≦ 6 mm | 99.999 | 7704-34-9 |
| SS-225 | Tellurium metal | Te | Target | 99.95 | 13494-80-9 |
| SS-227 | Tellurium metal | Te | Target | 99.5 | 13494-80-9 |
| T-2013 | Tellurium metal | Te | −20 mesh | 99.5 | 13494-80-9 |
| T-1200 | Tellurium metal | Te | 1-6 mm pieces | 99.9999 | 13494-80-9 |
| T-1203 | Tellurium metal | Te | −30 mesh | 99.99 | 13494-80-9 |
| T-2004 | Tellurium metal | Te | −60 mesh | 99.999 | 13494-80-9 |
| T-1020 | Tellurium metal | Te | 1-3 mm pieces | 99.999 | 13494-80-9 |
| T-1021 | Tellurium metal | Te | −200 mesh | 99.95 | 13494-80-9 |
| T-1022 | Tellurium metal | Te | −200 mesh | 99.5 | 13494-80-9 |

Se or S particles may alternatively be formed using an evaporation-condensation method. Alternatively, Se or S feedstock may be melted and sprayed ("atomization") to form droplets that solidify into nanoparticles.

The chalcogen particles 104 may also be formed using a solution-based technique, which also is called a "Top-Down" method (Nano Letters, 2004 Vol. 4, No. 10 2047-2050 "Bottom-Up and Top-Down Approaches to Synthesis of Monodispersed Spherical Colloids of low Melting-Point Metals"- Yuliang Wang and Younan Xia). This technique allows processing of elements with melting points below 400° C. as monodispersed spherical colloids, with diameter controllable from 100 nm to 600 nm, and in copious quantities. For this technique, chalcogen (Se or S) powder is directly added to boiling organic solvent, such as di(ethylene glycol) and melted to produce big droplets. After the reaction mixture had been vigorously stirred and thus emulsified for 20 min, uniform spherical colloids of metal obtained as the hot mixture is poured into a cold organic solvent bath (e.g. ethanol) to solidify the chalcogen (Se or Se) droplets.

Figure 2A:
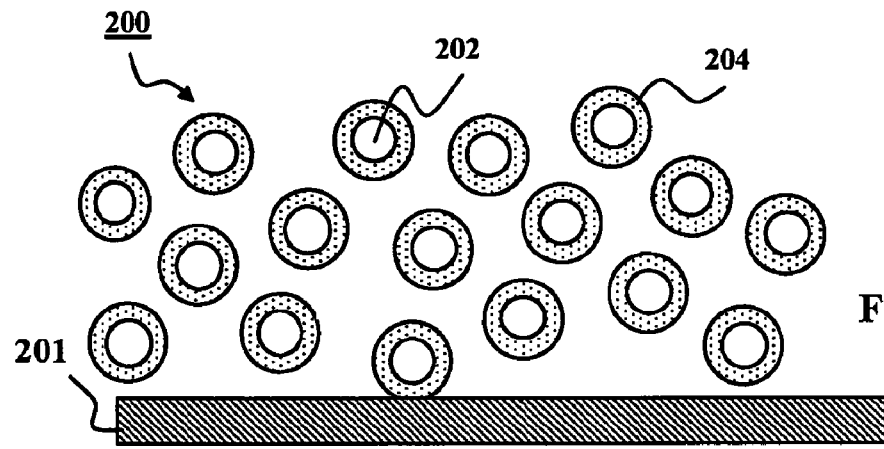
FIGS. 2A-2C are a sequence of schematic diagrams illustrating the formation of chalcogenide film from coated nanoparticles according to an alternative embodiment of the present invention.
Figure 2B:
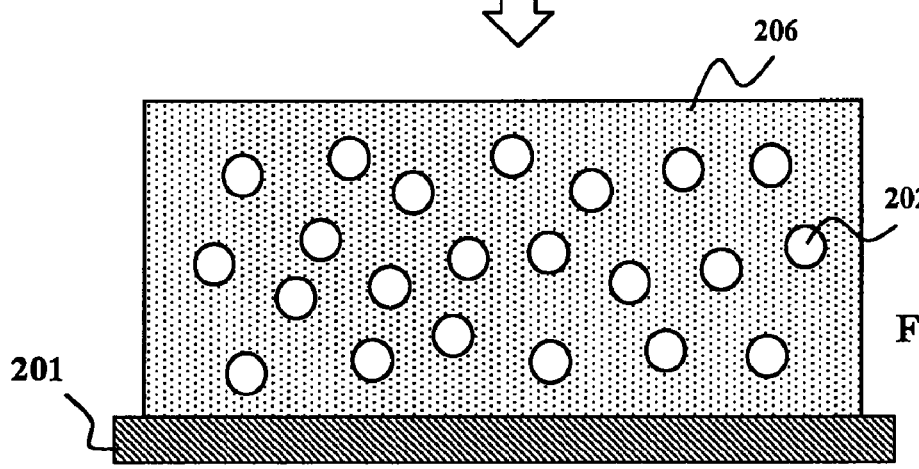
Figure 2C:
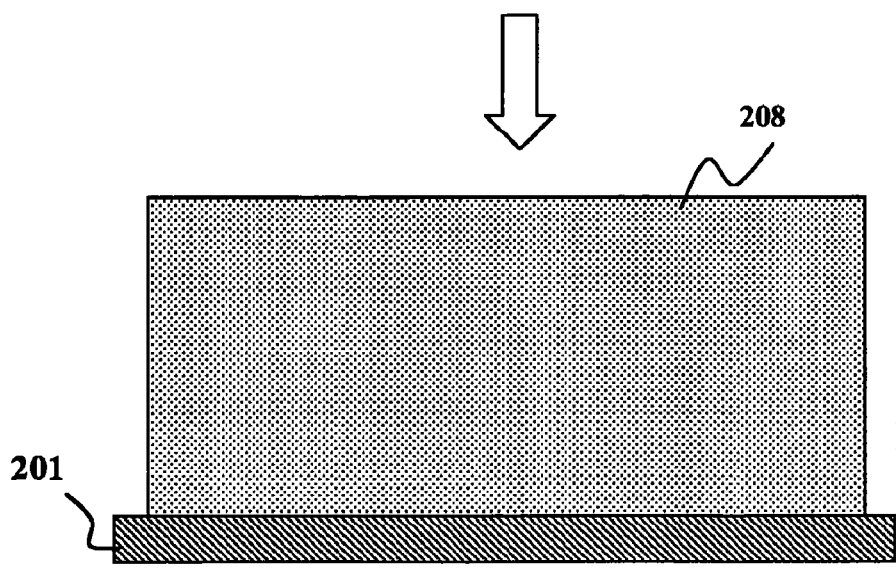

According to another embodiment of the present invention, a film of a group IB-IIIA-chalcogenide compound may be formed on a substrate 201 using core-shell nanoparticles 200 as shown in FIGS. 2A-2C. Each core-shell nanoparticle 200 has a core nanoparticle covered by a coating 204. The core nanoparticles 202 may be a mix of elemental particles of groups IB (e.g., Cu) and IIIA (e.g., Ga and In), which may be obtained by ball milling of elemental feedstock to a desired size. Examples of elemental feedstock materials available from Cerac, Incorporated of Milwaukee, Wis. are listed in Table III below.

a liquid chalcogen 206 as shown in FIG. 2B. The liquid chalcogen 206 and core nanoparticles 202 are heated to a temperature sufficient to react the liquid chalcogen 206 with the core nanoparticles 202 to form a dense film of group IB-IIIA-chalcogenide compound 208 as shown in FIG. 2C. The dense film of group IB-IIIA-chalcogenide is cooled down.

There are a number of different ways of forming the chalcogen coating 204 of the core-shell nanoparticles 200. Chalcogen shell 204 may be formed by agitating the core nanoparticles 202 into an airborne form, e.g. in an inert atmosphere of nitrogen or argon, and coating the core nanoparticles 202 by atomic layer deposition (ALD). The core nanoparticles 202 may be agitated into an airborne form, e.g., by placing them on a support and ultrasonically vibrating the support. ALD-based synthesis of coated nanoparticles may

TABLE III

| Item # | Chemical | Formula | Description | Typical % Purity | CAS # |
|---|---|---|---|---|---|
| C-2033 | Copper metal | Cu | 6 mm dia. × 6 mm pellets (melted) | 99.99 | 7440-50-8 |
| C-1229 | Copper metal | Cu | typ. 2-5 micron median (spherical, under argon) | 99 | 7440-50-8 |
| C-1239 | Copper metal | Cu | −100, +200 mesh | 99.5 | 7440-50-8 |
| -1240 | Copper metal | Cu | −200, +325 mesh | 99.5 | 7440-50-8 |
| C-1241 | Copper metal | Cu | −325 mesh | 99 | 7440-50-8 |
| C-1206 | Copper metal | Cu | −100 mesh (irregular shaped, under argon) | 99.999 | 7440-50-8 |
| C-1131 | Copper metal | Cu | 2-6 mm shot | 99.999 | 7440-50-8 |
| C-1132 | Copper metal | Cu | 2-6 mm shot | 99.9 | 7440-50-8 |
| C-1133 | Copper metal | Cu | −325 mesh (typ. ≦ 10 microns avg., irregular shape) | 99.5 | 7440-50-8 |
| C-2048 | Copper metal | Cu | typical aver. dia. 50-170 nanometers & surface area 4-15 $m^2$/g by BET | 99.9 ($O_2$ typ. 2-10%) | 7440-50-8 |
| C-2073 | Copper metal | Cu | 3 mm dia. × 3 mm pellets (melted) | 99.99 | 7440-50-8 |
| SS-338 | Copper metal | Cu | Target | 99.997 | 7440-50-8 |
| SS-349 | Copper metal | Cu | Target | 99.99 | 7440-50-8 |
| G-2006 | Gallium metal | Ga | 3 mm shot | 99.999999 | 7440-55-3 |
| G-2007 | Gallium metal | Ga | 3 mm shot | 99.99999 | 7440-55-3 |
| G-1066 | Gallium metal | Ga | 3 mm shot | 99.99 | 7440-55-3 |
| G-1073 | Gallium metal | Ga | 3 mm shot | 99.9999 | 7440-55-3 |
| G-1022 | Gallium metal | Ga | 3 mm shot | 99.999 | 7440-55-3 |
| I-2002 | Indium metal | In | 3 mm shot | 99.9999 | 7440-74-6 |
| I-1000 | Indium metal | In | 3 mm shot | 99.999 | 7440-74-6 |
| I-1001 | Indium metal | In | −325 mesh | 99.999 | 7440-74-6 |
| I-1075 | Indium metal | In | 3 mm shot | 99.99 | 7440-74-6 |
| SS-213 | Indium metal | In | Target | 99.999 | 7440-74-6 |
| SS-216 | Indium metal | In | Target | 99.99 | 7440-74-6 |
| I-2006 | Indium metal | In | −325 mesh | 99.99 | 7440-74-6 |

The core elemental nanoparticles 202 also may be obtained by evaporation-condensation, electro-explosion of wires and other techniques. Alternatively, the core nanoparticles 202 may be binary nanoparticles containing group IB and/or IIIA (e.g. CuSe, GaSe and InSe) as described above with respect to FIGS. 1A-1C. Furthermore, the core nanoparticles 202 may be ternary nanoparticles containing two different group IIIA elements (e.g. In and Ga) and a chalcogen (Se or S) or a group IB element.

Combinations of binary, ternary and elemental nanoparticles may also be used as the core nanoparticles 202. The coating 204 on the core nanoparticle 202 contains elemental non-oxygen chalcogen material (e.g. Se or S) as a source of extra chalcogen. The size of the core nanoparticles 202 is generally less than about 500 nm, preferably less than about 200 nm.

The core-shell nanoparticles 200 are heated to a temperature sufficient to melt the extra chalcogen coating 204 to form (optionally) use a metal organic precursor containing selenium such as dimethyl selenide, dimethyl diselenide, or diethyl diselenide or a sulfur-containing metal organic precursor, or $H_2Se$ or $H_2S$, or other selenium- or sulfur-containing compounds, and combinations or mixtures of the above. Both of these techniques are described in commonly-assigned U.S. patent application Ser. No. 10/943,657, now U.S. Pat. No. 7,306,823, which has been incorporated herein by reference. Other examples of coating nanoparticles are described in detail in commonly-assigned U.S. patent application Ser. No. 10/943,657, now U.S. Pat. No. 7,306,823, which has been incorporated herein by reference.

Alternatively, the coating 204 may be formed by agitating the core nanoparticles 202 into an airborne form, e.g. in an inert atmosphere of nitrogen or argon, and exposing the airborne core nanoparticles to a vaporized chalcogen Se or S.

Figure 3:
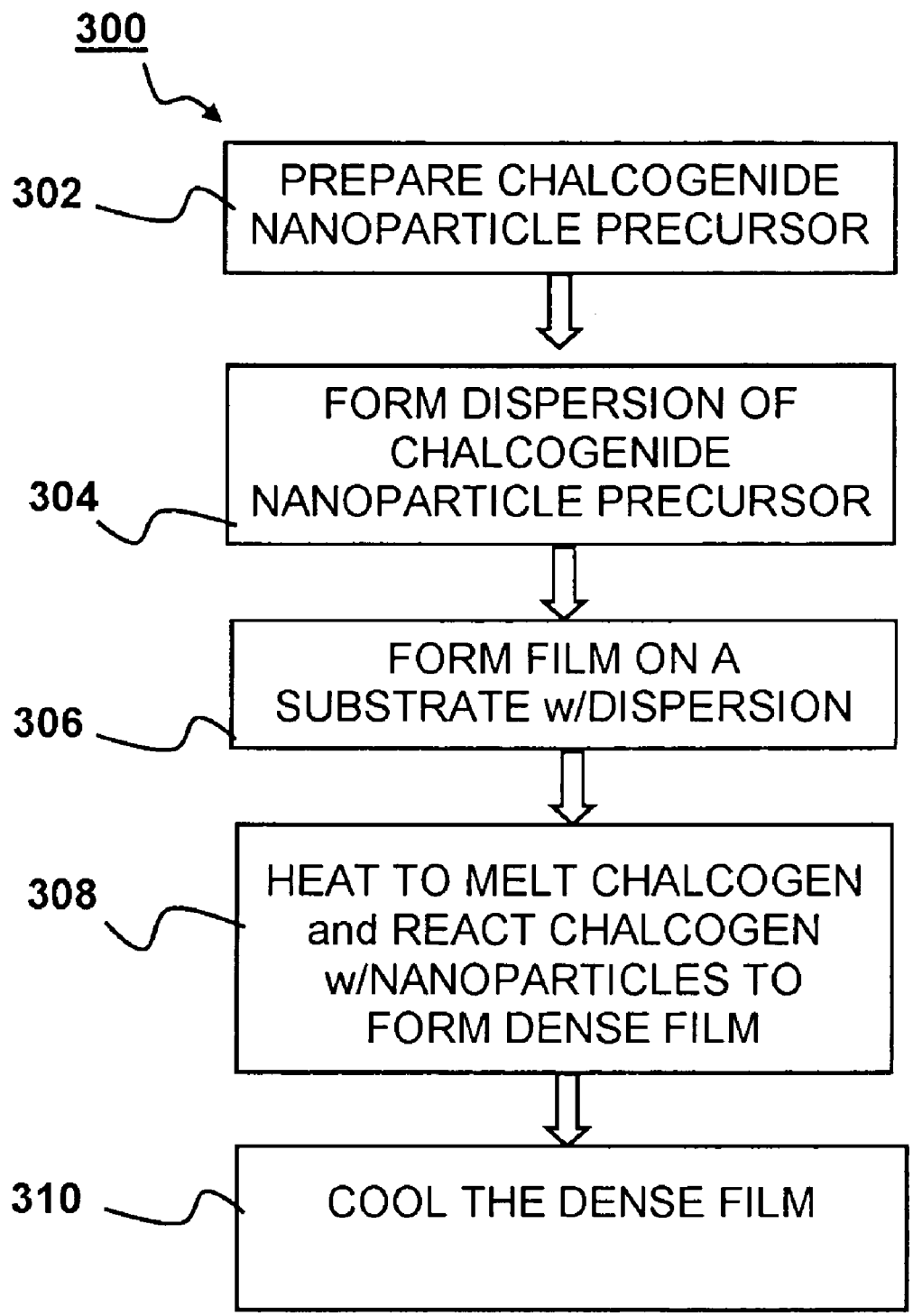
FIG. 3 is a flow diagram illustrating the fabrication of a chalcogenide layer using inks formed from nanoparticles according to an embodiment of the present invention.

Binary chalcogenide particles and extra chalcogen as described above with respect to FIG. 1A or core-shell nanoparticles as described above with respect to FIG. 2A may be mixed with solvents and other components to form an ink for solution deposition onto a substrate. The flow diagram of FIG. 3 illustrates a method 300 for forming a IB-IIIA-chalcogenide layer using inks formed from nanoparticle-based precursors. The method begins at step 302 by mixing the nanoparticles, e.g., binary chalcogenide particles and source of extra chalcogen, core-shell nanoparticles or some combination of both.

At step 304 a dispersion, e.g., an ink, paint or paste, is formed with the nanoparticles. Generally, an ink may be formed by dispersing the nanoparticles in a dispersant (e.g., a surfactant or polymer) along with (optionally) some combination of other components commonly used in making inks. Solvents can be aqueous (water-based) or non-aqueous (organic). Other components include, without limitation, binders, emulsifiers, anti-foaming agents, dryers, solvents, fillers, extenders, thickening agents, film conditioners, anti-oxidants, flow and leveling agents, plasticizers and preservatives. These components can be added in various combinations to improve the film quality and optimize the coating properties of the nanoparticulate dispersion. An alternative method to mixing nanoparticles and subsequently preparing a dispersion from these mixed nanoparticles (steps 302 and 304) would be to prepare separate dispersions for each individual type of nanoparticle and subsequently mixing these dispersions.

At step 306 a thin precursor film of the dispersion is then formed on a substrate by any of a variety of solution-based coating techniques including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like. The use of these and related coating and/or printing techniques in the non-vacuum based deposition of a ink, paste, or paint is not limited to ink, paste, and/or paints formed from nanoparticulates derived by the methods described above, but also using nanoparticles formed through a wide variety of other nanoparticles synthesis techniques, including but not limited to those described, e.g., in Published PCT Application WO 2002/084708 or commonly assigned U.S. patent application Ser. No. 10/782,017, now U.S. Pat. No. 7,663,057. The substrate may be an aluminum foil substrate or a polymer substrate, which is a flexible substrate in a roll-to-roll manner (either continuous or segmented) using a commercially available web coating system. Aluminum foil is preferred since it is readily available and inexpensive.

In some embodiments, the extra chalcogen, e.g., micron- or sub-micron-sized chalcogen powder is mixed into the dispersion containing the metal chalcogenides (in binary selenide or core-shell form) so that the nanoparticles and extra chalcogen are deposited at the same time. Alternatively the chalcogen powder may be deposited on the substrate in a separate solution-based coating step before or after depositing the dispersion containing the metal chalcogenides. Furthermore, the dispersion may include additional group IIIA elements, e.g., gallium in metallic form, e.g., as nanoparticles and/or nanoglobules and/or nanodroplets.

At step 308, the thin precursor film is heated to a temperature sufficient to melt the chalcogen source. The dispersion is further heated to react the chalcogen with other components. The temperature is preferably between 375° C. (temperature for reaction) and 500° C. (a safe temperature range for processing on aluminum foil or high-temperature polymer substrates). At step 310, the melted thin film and substrate are cooled down.

Note that the solution-based deposition of the proposed mixtures of nanopowders does not necessarily have to be performed by depositing these mixtures in a single step. Alternatively, step 306 may be performed by sequentially depositing nanoparticulate dispersions having different compositions of IB-, IIIA- and chalcogen-based particulates in two or more steps. For example would be to first deposit a dispersion containing an indium selenide nanopowder (e.g. with an In-to-Se ratio of ~1), and subsequently deposit a dispersion of a copper selenide nanopowder (e.g. with a Cu-to-Se ratio of ~1) and a gallium selenide nanopowder (e.g. with a Ga-to-Se ratio of ~1) followed by depositing a dispersion of Se. This would result in a stack of three solution-based deposited layers, which may be sintered together. Alternatively, each layer may be heated or sintered before depositing the next layer. A number of different sequences are possible. For example, a layer of $In_xGa_ySe_z$ with $x \geq 0$ (larger than or equal to zero), $y \geq 0$ (larger than or equal to zero), and $z \geq 0$ (larger than or equal to zero), may be formed as described above on top of a uniform, dense layer of $Cu_wIn_xGa_y$ with $w \geq 0$ (larger than or equal to zero), $x \geq 0$ (larger than or equal to zero), and $y \geq 0$ (larger than or equal to zero), and subsequently converting (sintering) the two layers into CIGS. Alternatively a layer of $Cu_wIn_xGa_y$ may be formed on top of a uniform, dense layer of $In_xGa_ySe_z$ and subsequently converting (sintering) the two layers into CIGS.

In alternative embodiments, nanoparticulate-based dispersions as described above may further include elemental IB, and/or IIIA nanoparticles (e.g., in metallic form). For example $Cu_xIn_yGa_zSe_u$ nanopowders, with $u > 0$ (larger than zero), with $x \geq 0$ (larger than or equal to zero), $y \geq 0$ (larger than or equal to zero), and $z \geq 0$ (larger than or equal to zero), may be combined with an additional source of selenium (or other chalcogen) and metallic gallium into a dispersion that is formed into a film on the substrate and sintered. Metallic gallium nanoparticles and/or nanoglobules and/or nanodroplets may be formed, e.g., by initially creating an emulsion of liquid gallium in a solution. Gallium metal or gallium metal in a solvent with or without emulsifier may be heated to liquefy the metal, which is then sonicated and/or otherwise mechanically agitated in the presence of a solvent. Agitation may be carried out either mechanically, electromagnetically, or acoustically in the presence of a solvent with or without a surfactant, dispersant, and/or emulsifier. The gallium nanoglobules and/or nanodroplets can then be manipulated in the form of a solid-particulate, by quenching in an environment either at or below room temperature to convert the liquid gallium nanoglobules into solid gallium nanoparticles. This technique is described in detail in commonly-assigned U.S. patent application Ser. No. 11/081,163, now abandoned to Matthew R. Robinson and Martin R. Roscheisen entitled "Metallic Dispersion", the entire disclosures of which are incorporated herein by reference.

Note that the method 300 may be optimized by using, prior to, during, or after the solution deposition and/or sintering of one or more of the precursor layers, any combination of (1) any chalcogen source that can be solution-deposited, e.g. a Se or S nanopowder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5) an $H_2$ atmosphere, (6) another reducing atmosphere, e.g. CO, and a (7) heat treatment.

Figure 4:
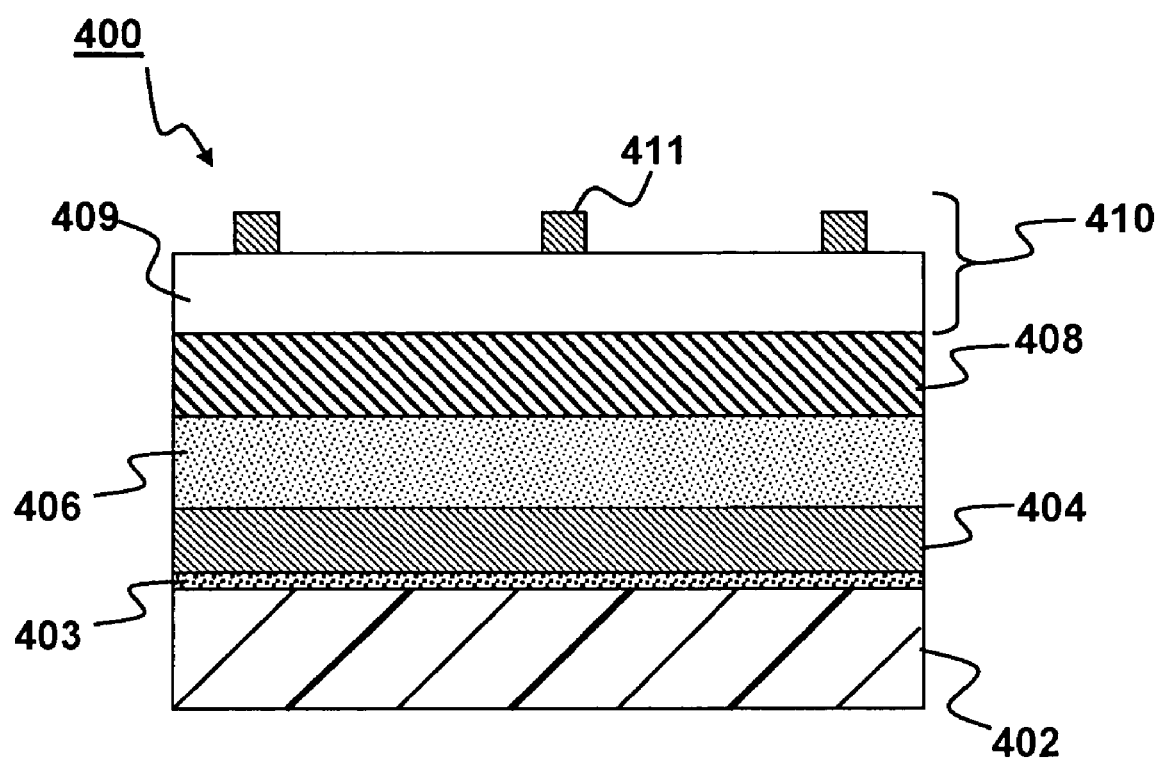
FIG. 4 is a schematic diagram of a photovoltaic cell according to an embodiment of the present invention.

Dense IB-IIIA-chalcogenide films fabricated as described above with respect to FIG. 3 may be used as absorber layers in photovoltaic cells. FIG. 4 depicts an example of a photovoltaic cell 400 that uses a combination of IB-IIIA-chalcogenide film as components of an absorber layer. The cell 400 generally includes a substrate or base layer 402, a base electrode 404, a IB-IIIA-chalcogenide absorber layer 406, a window layer 408, and a transparent electrode 410. The base layer 402 may be made from a thin flexible material suitable for roll-to-roll processing. By way of example, the base layer may be made of a metal foil, such as titanium, aluminum, stainless steel, molybdenum, or a plastic or polymer, such as polyimides (PI), polyamides, polyetheretherketone (PEEK), Polyethersulfone (PES), polyetherimide (PEI), polyethylene naphtalate (PEN), Polyester (PET), or a metallized plastic. The base electrode 404 is made of an electrically conductive material. By way of example, the base electrode 404 may be a layer of Al foil, e.g., about 10 microns to about 100 microns thick. An optional interfacial layer 403 may facilitate bonding of the electrode 404 to the substrate 402. The adhesion can be comprised of a variety of materials, including but not limited to chromium, vanadium, tungsten, and glass, or compounds such as nitrides, oxides, and/or carbides. The IB-IIIA-chalcogenide absorber layer 406 may be about 0.5 micron to about 5 microns thick after annealing, more preferably from about 0.5 microns to about 2 microns thick after annealing.

The window layer 408 is typically used as a junction partner for the IB-IIIA-chalcogenide absorber layer 406. By way of example, the window layer may include cadmium sulfide (CdS), zinc sulfide (ZnS), or zinc selenide (ZnSe), or n-type organic materials (e.g. polymers or small molecules), or some combination of two or more of these or similar materials. Layers of these materials may be deposited, e.g., by chemical bath deposition, to a thickness of about 1 nm to about 500 nm.

The transparent electrode 410 may include a transparent conductive oxide layer 409, e.g., zinc oxide (ZnO) or aluminum doped zinc oxide (ZnO:Al), or Indium Tin Oxide (ITO), or cadmium stannate, any of which can be deposited using any of a variety of means including but not limited to sputtering, evaporation, CBD, electroplating, CVD, PVD, ALD, and the like.

Alternatively, the transparent electrode 410 may include a transparent conductive polymeric layer 409, e.g. a transparent layer of doped PEDOT (Poly-3,4-Ethylenedioxythiophene), which can be deposited using spin, dip, or spray coating, and the like. PSS:PEDOT is a doped conducting polymer based on a heterocyclic thiophene ring bridged by a diether. A water dispersion of PEDOT doped with poly(styrenesulfonate) (PSS) is available from H. C. Starck of Newton, Mass. under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT chemically may attack, react with, or otherwise degrade the other materials in the solar cell. Removal of acidic components in PEDOT can be carried out by anion exchange procedures. Non-acidic PEDOT can be purchased commercially. Alternatively, similar materials can be purchased from TDA materials of Wheat Ridge, Colo., e.g. Oligotron™ and Aedotron™. The transparent electrode 410 may further include a layer of metal (e.g., Ni, Al or Ag) fingers 411 to reduce the overall sheet resistance.

An optional encapsulant layer (not shown) provides environmental resistance, e.g., protection against exposure to water or air. The encapsulant may also absorb UV-light to protect the underlying layers. Examples of suitable encapsulant materials include one or more layers of polymers such as THZ, Tefzel® (DuPont), tefdel, thermoplastics, polyimides (PI), polyamides, polyetheretherketone (PEEK), Polyethersulfone (PES), polyetherimide (PEI), polyethylene naphtalate (PEN), Polyester (PET), nanolaminate composites of plastics and glasses (e.g. barrier films such as those described in commonly-assigned, co-pending U.S. Patent Application Publication 2005/0095422, to Brian Sager and Martin Roscheisen, filed Oct. 31, 2003, and entitled "INORGANIC/ORGANIC HYBRID NANOLAMINATE BARRIER FILM", which is incorporated herein by reference), and combinations of the above.

Embodiments of the present invention provide low-cost, highly tunable, reproducible, and rapid synthesis of a nanoparticulate chalcogenide and chalcogen material for use as an ink, paste, or paint in solution-deposited absorber layers for solar cells. Coating the nanoparticles allows for precisely tuned stoichiometry, and/or phase, and/or size, and/or orientation, and/or shape of the chalcogenide crystals in the chalcogenide film e.g., for a CIGS polycrystalline film. Embodiments of the present invention provide an absorber layer with several desirable properties, including but not limited to relatively high density, high uniformity, low porosity, and minimal phase segregation.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forming a film of a group IB-IIIA-chalcogenide compound, comprising the steps of:
    forming a nanoparticle precursor material including group IB-chalcogenide and/or group IIIA-chalcogenide nanoparticles;
    disposing the nanoparticle precursor material and a source of extra chalcogen on a surface of a substrate; and
    heating the nanoparticle precursor material and source of extra chalcogen to a temperature sufficient to melt the extra chalcogen and to react the chalcogen with the group IB-chalcogenide nanoparticles and/or group IIIA chalcogenide nanoparticles to form a film of a group IB-IIIA-chalcogenide compound;
    wherein the nanoparticles include a chalcogenide core with a chalcogen-containing coating, whereby the coating provides the extra source of chalcogen.

2. The method of claim 1 wherein the group IB chalcogenide is a non-oxide chalcogenide.

3. The method of claim 1 wherein the group IIIA chalcogenide is a non-oxide chalcogenide.

4. The method of claim 1 wherein the group IB chalcogenide is a non-oxide chalcogenide and the group IIIA chalcogenide is a non-oxide chalcogenide.

5. The method of claim 1 wherein the group IB-IIIA chalcogenide compound is a non-oxide chalcogenide compound.

6. The method of claim 1 wherein the nanoparticle precursor material includes group IB-chalcogenide nanoparticles containing a chalcogenide material in the form of an alloy of a chalcogen and an element of group IB and/or wherein the nanoparticle precursor material includes group IIIA-chalcogenide nanoparticles containing a chalcogenide material in the form of an alloy of a chalcogen and one or more elements of group IIIA.

7. The method of claim 1 wherein the nanoparticle precursor material includes group IB-chalcogenide nanoparticles containing a non-oxide chalcogenide material in the form of an alloy of a non-oxygen chalcogen and an element of group IB and/or wherein the nanoparticle precursor material includes group IIIA-chalcogenide nanoparticles containing a non-oxide chalcogenide material in the form of an alloy of a non-oxygen chalcogen and one or more elements of group IIIA.

8. The method of claim 1 wherein the source of extra chalcogen includes particles of an elemental chalcogen.

9. The method of claim 1 wherein the chalcogen is selenium or sulfur or tellurium.

10. The method of claim 1, wherein the group IB element is copper.

11. The method of claim 1 wherein the one or more elements of group IIIA include gallium and/or indium and/or aluminum.

12. The method of claim 1 wherein the nanoparticles of one or more chalcogenide materials include indium selenide nanoparticles, and/or copper selenide nanoparticles and and/or gallium selenide nanoparticles.

13. The method of claim 1 wherein the nanoparticles of one or more chalcogenide materials include indium sulfide nanoparticles, and/or copper sulfide nanoparticles and/or gallium sulfide nanoparticles.

14. The method of claim 1 wherein the nanoparticles of one or more chalcogenide materials include indium telluride nanoparticles, and/or copper telluride nanoparticles and/or gallium telluride nanoparticles.

15. The method of claim 1 wherein the nanoparticles are characterized by a size that is less than about 500 nm.

16. The method of claim 1 wherein the nanoparticles are characterized by a size that is less than about 200 nm.

17. The method of claim 1 wherein forming the nanoparticle precursor includes forming a dispersion containing the nanoparticles.

18. The method of claim 17 wherein disposing the nanoparticles and extra source of chalcogen on the surface of the substrate includes forming a film of the dispersion on a substrate.

19. The method of claim 1 wherein heating the nanoparticles includes heating the nanoparticle precursor to a temperature greater than about 375 C. but less than a maximum temperature for processing the substrate.

20. The method of claim 19 wherein the maximum temperature for processing the substrate is less than about 500 C.

21. The method of claim 19 wherein the maximum temperature for processing the substrate is less than about 575 C.

22. The method of claim 19 wherein the substrate is a flexible substrate.

23. The method of claim 19 wherein the substrate is a metallic foil made of a metal chosen from the group of Al, Mo, Ti, Steel, and/or alloys of these and/or similar metals.

24. The method of claim 19 wherein the substrate is a polymer substrate or a metallized polymer substrate.

25. The method of claim 1 wherein disposing the nanoparticles and a source of extra chalcogen on a surface of a substrate includes, mixing the source of extra chalcogen with the group IB-chalcogenide nanoparticles and/or group IIIA-chalcogenide nanoparticles.

26. The method of claim 1 wherein disposing the nanoparticles on the substrate includes a non-vacuum technique.

27. The method of claim 1 wherein disposing the nanoparticle precursor on the substrate includes a solution based coating technique.

28. The method of claim 27 wherein the solution based coating technique is chosen from the group of web coating, spray coating, spin coating, doctor blade coating, printing techniques including contact printing, gravure printing, microgravure printing, ink-jet printing, jet deposition.

29. The method of claim 1, further comprising solidifying the dense film.

30. The method of claim 1 wherein the source of extra chalcogen is in the form of a powder containing sub-micron or micron-sized particles.

31. The method of claim 30, further comprising mixing the powder into a dispersion containing the group IB-chalcogenide nanoparticles and/or the group IIIA-chalcogenide nanoparticles.

32. The method of claim 30 wherein disposing the group IB-chalcogenide nanoparticles and/or group IIIA-chalcogenide nanoparticles and a source of extra chalcogen on a surface of a substrate includes depositing the powder onto the substrate prior to depositing a dispersion containing the group IB-chalcogenide nanoparticles and/or the group IIIA-chalcogenide nanoparticles.

33. The method of claim 30 wherein disposing the group IB-chalcogenide nanoparticles, and/or group IIIA-chalcogenide nanoparticles and a source of extra chalcogen on a surface of a substrate includes depositing the powder onto the substrate after depositing a dispersion containing the group IB-chalcogenide nanoparticles and/or the group IIIA-chalcogenide nanoparticles.

34. The method of claim 1 wherein the nanoparticle precursor further includes nanoparticles and/or nanoglobules and/or nanodroplets of metallic gallium.

35. The method of claim 1 wherein disposing the nanoparticle precursor material and the source of extra chalcogen on the surface of the substrate includes sequentially depositing two or more layers of nanoparticle precursor materials having different compositions of IB-, IIIA- and/or non-oxygen chalcogen-based particulates.

36. The method of claim 35 wherein disposing the nanoparticle precursor material and a source of extra chalcogen on a surface of a substrate includes depositing a first layer containing a group IIIA non-oxygen chalcogenide nanopowder and subsequently depositing a second layer containing a group IB non-oxide chalcogenide nanopowder and/or a different group IIIA non-oxide chalcogenide nanopowder.

37. The method of claim 36, further comprising the step of depositing a layer containing a non-oxygen chalcogen.

38. The method of claim 36 wherein heating the nanoparticle precursor material and source of extra non-oxygen chalcogen includes sintering the first and second layers together.

39. The method of claim 36 wherein heating the nanoparticle precursor material and source of extra non-oxygen chalcogen includes sintering the first layer before sintering the second layer.

40. A method for forming a film of a group IB-IIIA-chalcogenide compound, comprising the steps of: obtaining core nanoparticles containing one or more elements from group IB and/or IIIA; coating the core nanoparticles with an elemental non-oxygen chalcogen material to produce core-shell nanoparticles; disposing a film containing the core-shell nanoparticles on a surface of a substrate; heating the film to a temperature sufficient to melt the non-oxygen chalcogen material and to react the non-oxygen chalcogen material with the group IB and group IIIA elements to form a dense film of a group IB-IIIA-non-oxide chalcogenide compound.

41. The method of claim 40, further comprising solidifying the dense film.

42. The method of claim 40 wherein the core nanoparticles include nanoparticles of a group IB element and nanoparticles of one or more group IIIA elements.

43. The method of claim 40 wherein the group IB element is copper.

44. The method of claim 40 wherein the group IIIA elements include indium and/or gallium and/or aluminum.

45. The method of claim 40 wherein the non-oxygen chalcogen material is selenium and/or sulfur and/or tellurium.

46. The method of claim 40 wherein the core-shell nanoparticles include core nanoparticles of a binary alloy, the binary alloy containing a group IB element and a chalcogen.

47. The method of claim 46 wherein the group IB element is copper and the chalcogen is selenium or sulfur or tellurium.

48. The method of claim 40 wherein the core-shell nanoparticles include core nanoparticles of a binary alloy, the binary alloy containing a group IIIA element and a chalcogen.

49. The method of claim 48 wherein the group IIIA element is indium or gallium and the chalcogen is selenium or sulfur or tellurium.

50. The method of claim 40 wherein the core-shell nanoparticles include core nanoparticles of a ternary alloy, the ternary alloy containing two different group IIIA elements and a chalcogen or a group IB element, a group IIIA element and a chalcogen.

51. The method of claim 50 wherein the two different group IIIA elements are indium and gallium and the chalcogen is selenium or sulfur or tellurium.

52. The method of claim 40 wherein disposing the core-shell nanoparticles on the surface of the substrate includes forming an ink containing the core-shell nanoparticles.

53. The method of claim 52 wherein disposing the core-shell nanoparticles on the surface of the substrate includes forming a film of the ink on a substrate.

54. The method of claim 40 wherein heating the nanoparticles includes heating the nanoparticles to a temperature greater than about 375 C. but less than a maximum temperature for processing the substrate.

55. The method of claim 54 wherein the maximum temperature for processing the substrate is less than about 500 C.

56. The method of claim 54 wherein the maximum temperature for processing the substrate is less than about 575 C.

57. The method of claim 54 wherein the substrate is a flexible substrate.

58. The method of claim 54 wherein the substrate is a metallic foil made of a metal chosen from the group of Al, Mo, Ti, Steel, and/or alloys of these and/or similar metals.

59. The method of claim 54 wherein the substrate is a polymer substrate or a metallized polymer substrate.

60. The method of claim 40 wherein the core-shell nanoparticles include core nanoparticles of a binary alloy, the binary alloy containing a group IB element and a group IIIA element.

61. The method of claim 40 wherein the core-shell nanoparticles include core nanoparticles of a binary alloy, the binary alloy containing two group IIIA elements.

62. The method of claim 40, further comprising mixing a source of extra non-oxygen chalcogen material with the core-shell nanoparticles.

63. The method of claim 40 wherein the core-shell nanoparticles include core nanoparticles of a binary alloy, the binary alloy containing a group IB element and a chalcogen.

64. The method of claim 63 wherein the group IB element is copper and the chalcogen is selenium and/or sulfur and/or tellurium.

65. The method of claim 40 wherein the core-shell nanoparticles include core nanoparticles of a binary alloy, the binary alloy containing a group IIIA element and a chalcogen.

66. The method of claim 40 wherein the core-shell nanoparticles include core nanoparticles of a ternary alloy, the ternary alloy containing two different group IIIA elements and a chalcogen.

67. The method of claim 66 wherein the two different group IIIA elements are indium and gallium and the chalcogen is selenium or sulfur or tellurium.

68. The method of claim 40 wherein disposing the film containing the core-shell nanoparticles on the surface of the substrate includes sequentially depositing two or more layers of nanoparticle precursors having different compositions of IB-, IIIA- and non-oxygen chalcogen-based particulates.

69. The method of claim 68 wherein heating the film includes sintering the two or more layers together.

70. The method of claim 68 wherein heating the film includes sintering a first layer before sintering a second layer.

* * * * *